United States Patent [19]

Casey, Jr. et al.

[11] Patent Number: 6,042,738
[45] Date of Patent: Mar. 28, 2000

[54] PATTERN FILM REPAIR USING A FOCUSED PARTICLE BEAM SYSTEM

[75] Inventors: J. David Casey, Jr., West Roxbury, Mass.; Andrew Doyle, Epping, N.H.

[73] Assignee: Micrion Corporation, Peabody, Mass.

[21] Appl. No.: 08/834,356

[22] Filed: Apr. 16, 1997

[51] Int. Cl.$^7$ ...................................................... C23F 1/00
[52] U.S. Cl. ............................................. 216/66; 216/63
[58] Field of Search ........................................ 216/63, 66

[56] References Cited

U.S. PATENT DOCUMENTS

| | | | |
|---|---|---|---|
| 4,498,953 | 2/1985 | Cook et al. | 156/646 |
| 4,851,097 | 7/1989 | Hattori et al. | 204/192.33 |
| 4,994,140 | 2/1991 | Kenzo et al. | 156/643 |
| 5,799,104 | 8/1998 | Nakamura et al. | 382/144 |

FOREIGN PATENT DOCUMENTS

| | | |
|---|---|---|
| 0 649 169 A2 | 4/1995 | European Pat. Off. . |
| 7-333828 | 12/1995 | Japan . |

OTHER PUBLICATIONS

Xlmen, H., et al., "Halogen–based selective FIB milling for IC probe–point creation and repair", *Proceedings of the 20th International Symposium for Testing and Failure Analysis*, pp. 141–149 (Nov. 1994).

Satoh, Y., et al., "Performance of has assist FIB repair for opaque defects", *SPIE*, vol. 2884, pp. 124–137 (1996).

Aita, K., et al., "New technique for repairing opaque defects", *SPIE*, vol. 2512, pp. 412–419 (1995).

Stark, T.J., et al., "H20 enhanced focused ion beam micromachining", *J. Vac. Sci. Technol., B*, vol. 13, No. 6, pp. 2565–2569 (1995).

Young, R.J., et al., "Characteristics of gas–assisted focused ion beaming etching", *J. Vac. Sci. Technol. B.*, vol. 11, No. 2, pp. 234–241 (Mar./Apr. 1993).

Harriott, L.R., "Focused ion beam $XeF_2$ etching of materials for phase–shift masks", *J. Vac. Sci. Technol. B.* vol. 11 No.. 6 (Nov./Dec. 1993).

Komuro, M., et al., "Focused Ga ion beam etching characteristics of GaAs with $Cl_2$", *J. Vac. Sci. Technol. B* vol. 9, No. 5 (Sep./Oct. 1991).

Gandhi, Anil, et al. "Parametric modeling of focused ion beam induced etching", *J. Vac. Sci. Technol. B* vol. 8, No. 6 (Nov./Dec. 1990).

Xu, Zheng, et al. "Ion beam assisted etching of $SiO_2$ and $Si_3N_4$" *J. Vac. Sci. Technol. B* vol. 6, No. 3 (May/Jun. 1988).

McNevin, S.C., et al., "Investigation of the kinetic mechanism for the ion–assisted etching of GaAs in $Cl_2$ using a modulated ion beam", *J. Appl. Phys.* vol. 58, No. 12 (Dec. 1985).

(List continued on next page.)

*Primary Examiner*—Bruce Breneman
*Assistant Examiner*—Alua Powell
*Attorney, Agent, or Firm*—Lahive & Cockfield, LLP

[57] ABSTRACT

The present invention generally provides methods for employing a focused particle beam system in the removal of an excess portion from a workpiece having an opaque film patterned on a substrate and more particularly provides methods of gas-assisted etching using an etching gas including bromine. One aspect of the invention provides a method including the steps of (i) mounting the workpiece on a movable stage capable of movement in the X and Y directions, (ii) scanning a selected surface area of a workpiece, having an opaque film patterned on a substrate, with a focused particle beam, (iii) detecting intensities of particles emitted from the workpiece as a result of the workpiece scanning step, (iv) determining a shape of the patterned film based on the detected particle intensities, (v) determining an excess portion of the patterned film based on the shape of the patterned film, (vi) etching the excess portion with the focused particle beam, and (vii) introducing an etching gas, concurrent with the etching step, in selected proximity to the excess portion. The etching gas includes bromine or a bromine-containing material. The etching gas can further include water vapor.

25 Claims, 5 Drawing Sheets

OTHER PUBLICATIONS

Coburn, J.W., et al., "Ion– and electron–assisted gas–surface chemistry—An important effect in plasma etching", *J. Appl. Phys.* vol. 50, No. 5 (May 1979).

K. Van Doorselaer, M. Van den Reeck, L Van den Bempt, R. Young and J. Whitney, "How to Prepare Golden Devices Using Lesser Materials," *STFA '93: The 19th International Symposium for Testing & Failure Analysis* (Los Angeles, CA, Nov. 15–19, 1993) pp. 405–414.

M.L. Thayer, "Enhanced Focused Ion Beam Milling Applications," *ISTFA '93: The 19th International Symposium for Testing & Failure Analysis* (Los Angeles, CA, Nov. 15–19, 1993), pp. 425–429.

Abramo, M. et al., "Gas Assisted Etching: An Advanced Technique for Focused Ion Beam Device Modification", *Proceedings of the 20th International Symposium for Testing and Failure Analysis* (Nov. 12–18, 1994).

Morgan, J., "Ion Beams in Focus", *European Semicondcutor* (Mar. 1996).

Tyndall, G.W. et al., "Laser–Induced Etching of Titanium by $Br_2$ and $CCl_3Br$ at 248 nm", *Applied Physics A: Solids and Surfaces* A50 (1990) Jun., No. 6, Berlin, DE.

Reming, R., "Focus Ions Beam Phase Shift Mask Repair (Fib or Fact?)", *SPIE vol. 2322 Photomask Technology and Management* (1994).

J. David Casey, Jr., et al., "Chemically Enhanced FIB Repair of Opaque Defects on Chrome Photomasks", *SPIE* vol. 3096 (1997).

PATTERN FILM REPAIR USING A FOCUSED PARTICLE BEAM SYSTEM

BACKGROUND

The invention relates in general to focused ion beam processing and more particularly to the repair of a workpiece, having an opaque film patterned on a substrate, such as a photomask, X-ray mask, or reticle.

Manufacturers of such workpieces are extensively employing focused ion beam (FIB) methods for the selective removal of material without the use of a patterned resist mask. Advantageously, a FIB system can operate both as a scanning ion microscope (SIM) and as a precision milling system. Thus, using FIB methods, manufacturers can image a workpiece (deriving the image from ion beam induced particles, e.g. secondary-electrons or secondary-ions), locate a defect on a patterned opaque film of a workpiece, and then mill micron or submicron scale features at the location of the defect. The term manufacturers, as used herein, encompasses both those who create and those who repair the above-mentioned workpieces.

Thus, one of the primary applications for FIB micromachining systems is the repair of masks and reticles. In many applications, manufacturers employ pure sputtering, i.e. not gas-assisted sputtering, to mill the desired structures. Scanning a focused beam of ions over a substrate surface physically sputters away substrate particles, including atoms, ions and molecules. Non-volatile sputtered material will condense on any surface it encounters. This effect, known as redeposition, limits the precision of microstructure fabrication. The redeposition effect is particularly noticeable at the side walls of an etched recess, especially if the recess has a high aspect ratio, e.g. a narrow, deep groove.

Some shortcomings presently found in the FIB repair of defects in a patterned film on a substrate are:
- incomplete removal of opaque material
- a decrease in the transmission of electromagnetic radiation due to absorption by ions implanted in the substrate (normally quartz). This "staining" phenomenon is more pronounced as the lithographic illumination moves from near ultraviolet, i.e. UV (365 nm), to deep ultraviolet, i.e. DUV (248 nm and 193 nm), wavelengths; and
- excess removal of substrate below and surrounding (riverbed effect) the opaque defect.

During particle beam processes, such as particle beam deposition and particle beam etching with a focused beam, the workpiece to be processed is disposed within a vacuum chamber and positioned beneath a column that generates a particle beam. The particle beam column is activated and generates particles that strike the surface of the workpiece. To facilitate the processing of the workpiece, reactant materials, typically fluids, and more typically gases, can be directed at the surface of the workpiece being processed. The reactant materials cooperate with the particle beam to enhance or modify the deposition or etching process being performed. When a gas is directed at the surface of the workpiece during FIB etching, the process is typically referred to as gas-assisted etching (GAE).

U.S. Pat. No. 4,951,097 by Hattori et al., incorporated herein by reference, discloses an apparatus for repairing a pattern film using a Chlorine etching gas. However, a GAE system that uses chlorine has drawbacks. An effective chlorine GAE system requires a vacuum pump that tends not to generate impurity gas. Also, the GAE system itself is subject to the corrosive effect of the chlorine. Furthermore, Chlorine may not provide selective etching or enhanced etching to the extent required by current manufacturers.

Japanese Patent Application No. 6-129260, incorporated herein by reference, discloses using Iodine gas during GAE. However, Iodine also has disadvantages. Iodine often requires heating to establish enough vapor pressure to assist in the etching process. Heated elements within a chamber contribute to thermally-induced mechanical drift of the assembly holding the mask, which decreases an operator's ability to maintain the mask's location relative to the FIB over time. This heating can also cause thermal expansion of the mask. Such thermal expansion of the mask during FIB micromachining is undesirable because the dimensions of the mask's microstructures are critical. Iodine can also be difficult to pump off the workpiece. Thus, iodine can continue to etch when the workpiece is removed from the vacuum chamber. Furthermore, Iodine can be difficult to use because of its odor.

GAE is generally described in "Characteristics of gas-assisted focused ion beam etching" by R. J. Young, J. R. A. Cleaver, and H. Ahmed, J. Vac. Sci. Technol. B., 11(2), p.234, (1992), incorporated herein by reference.

Accordingly, it is an object of this invention to provide methods of GAE that provide an improved repair of defects in an opaque film patterned on a substrate.

SUMMARY OF THE INVENTION

The present invention provides methods for employing a focused particle beam system in the removal of an excess portion from a workpiece having an opaque film patterned on a substrate. In one aspect, the invention provides a method including the steps of (i) mounting the workpiece on a movable stage capable of movement in the X and Y directions, (ii) scanning a selected surface area of a workpiece, having an opaque film patterned on a substrate, with a focused particle beam, (iii) detecting intensities of particles emitted from the workpiece as a result of the workpiece scanning step, (iv) determining a shape of the patterned film based on the detected particle intensities, (v) determining an excess portion of the patterned film based the shape of the patterned film, (vi) etching the excess portion with the focused particle beam, and (vii) introducing an etching gas, concurrent with the etching step, in selected proximity to the excess portion. The etching gas includes bromine. The etching gas can further include water vapor. Manufacturers can pattern a variety of opaque films onto the substrate, including chromium-based film and molybdenum silicide-based film. Manufacturers can make the substrate out of a variety of materials, including quartz.

In one practice of the invention, the method described above can further include the steps of (i) scanning a selected portion of the substrate, subsequent to said introducing step, with the focused particle beam, and (ii) applying a clean-up gas, concurrent to the substrate scanning step, to remove a surface layer of the selected portion of the substrate for insuring high transmission of electromagnetic radiation by the selected portion of the substrate. Manufacturers can use a fluorine-based clean-up gas, such as xenon difluoride.

In another practice of the invention, the step of scanning a selected surface area of the workpiece can include the further step of introducing, concurrent to the scanning step, an etching gas containing bromine in selected proximity to the selected surface area.

The term bromine, as used herein, encompasses any compound that includes a bromine atom within the skeleton of that compound. Preferably, the above-mentioned compound is a compound that can produce molecular bromine under the conditions employed for gas-assisted etching.

The term chromium film, as used herein, encompasses chromium film and chromium-oxygen film.

The term molybdenum silicide film, as used herein, encompasses molybdenum silicide film and molybdenum silicide nitrogen oxygen film.

The term particle beam as used herein, encompasses ion beams, electron beams, neutral particle beams, x-ray beams and any other directed radiation suitable for imaging or etching a workpiece. Moreover, as explained in greater detail hereinafter, the term particle beam shall include ion beams, including gallium ion beams generated by commercially available focused ion beam (FIB) systems and inert gas (for example, helium and argon) ion beams generated by a gas field ion source (GFIS).

DETAILED DESCRIPTION OF THE ILLUSTRATED EMBODIMENTS

Scanning a focused beam of particles over a substrate surface physically sputters away substrate particles, i.e. atoms, ions and molecules. This sputtering process can be enhanced by introducing vapor phase etchants which react under the influence of the particle beam with the substrate material to form reactant species; these species are more volatile than the particles produced by the beam alone. These volatile reaction products are more easily removed from the substrate surface, thus enhancing the efficiency of the sputtering process. Selective etching can occur which can be beneficial in activities such as repairing opaque defects. Selective etching occurs when the introduction of vapor phase etchants enhances the focused particle beam removal of one material, e.g. chromium film, while inhibiting the removal of another material, e.g. a quartz substrate. For example, an etchant which is selective for opaque chromium film relative to a quartz substrate would allow a thickness of the chromium film to be removed by less beam dose than required for an equal thickness of quartz. This selective etching allows for faster, more complete removal of an excess portion of an opaque film patterned on a substrate with less particle beam dose, less removal of the substrate near the perimeter of the excess portion (riverbedding), and less staining of the substrate.

Figure 1:
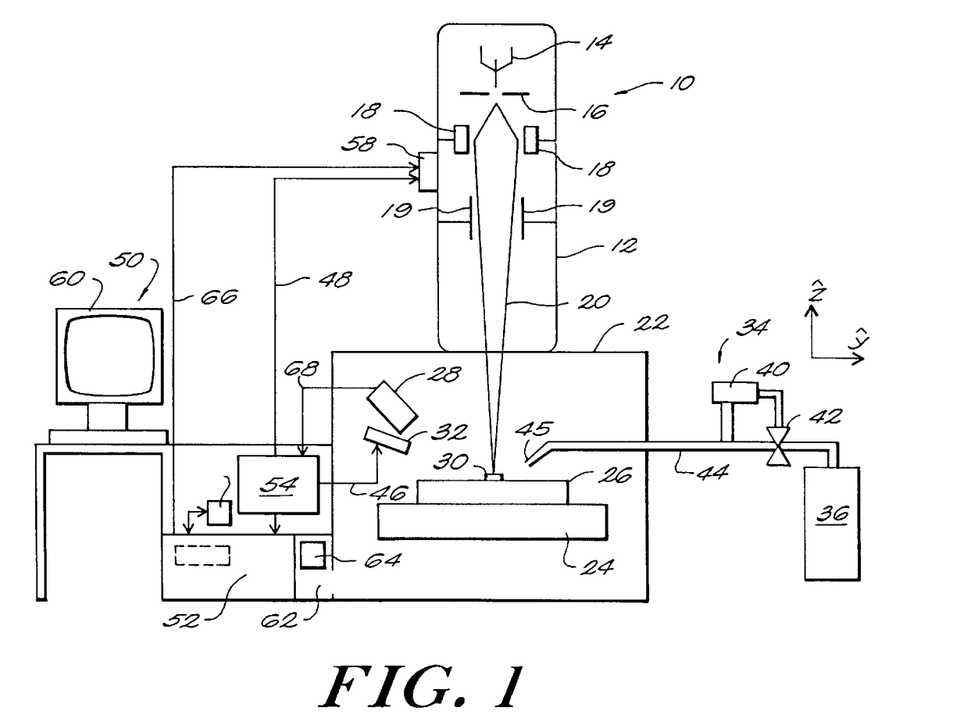
FIG. 1 is a schematic of a focused particle beam system for practice of the invention.
Figure 4A:
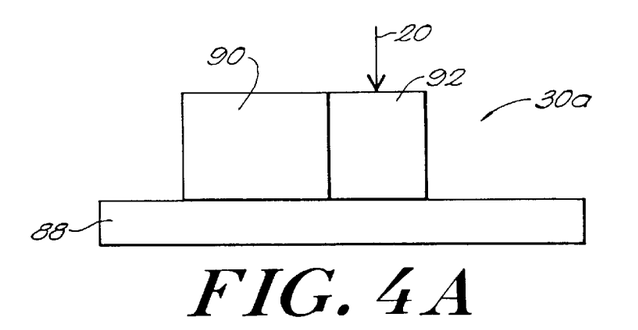
FIGS. 4A–4C show cross-sectional views of the workpiece of FIG. 1 illustrating the changes in the workpiece as it undergoes one embodiment of the repair process according to the invention.
Figure 4B:
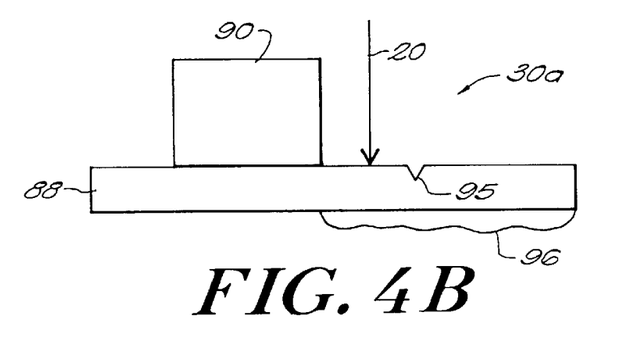
Figure 4C:
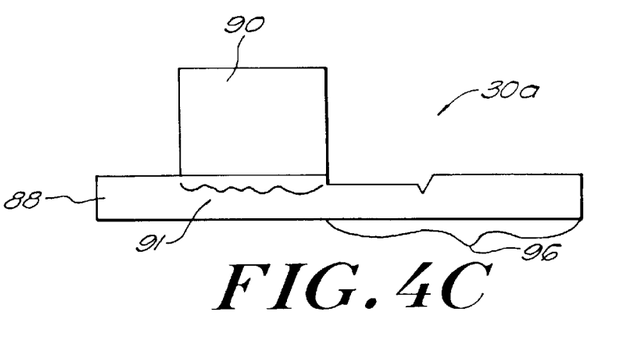
Figure 5:
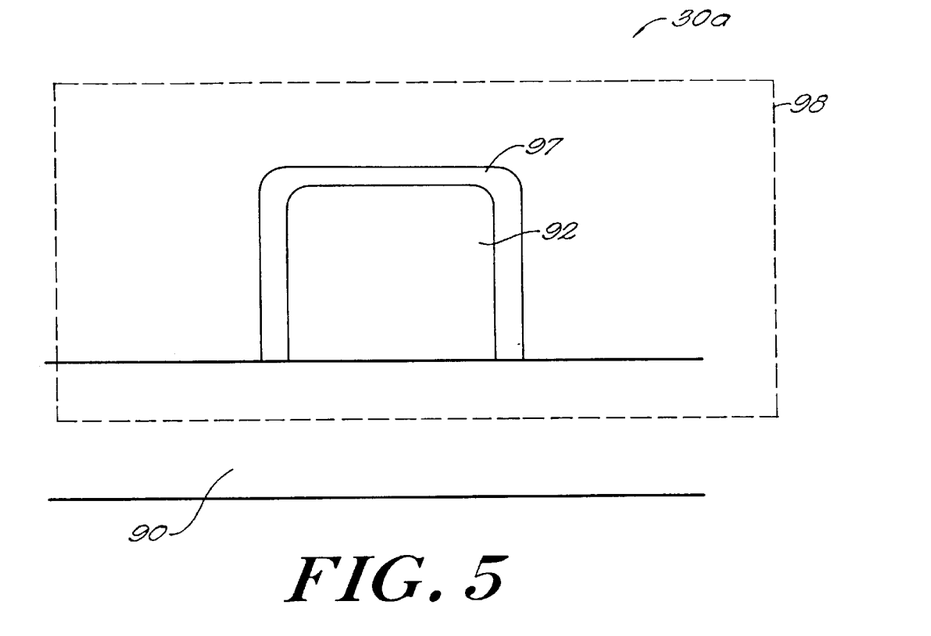
FIG. 5 is top schematic view of a repaired defect and an associated riverbed for the patterned film of FIGS. 4A–4C.

FIG. 1 depicts one embodiment of a focused particle beam, i.e. a focused ion beam (FIB) system 10 according to the invention for repairing opaque films patterned on a substrate. The system 10 of FIG. 1 includes an ion column 12, a vacuum chamber 22, a reactant material delivery system 34 and user control station 50. The system 10 provides a focused particle beam system that can precisely mill a workpiece having an opaque film patterned on a substrate. The workpiece is seated within the vacuum chamber 22 and operated on by an ion beam generated by the column 12 to image and mill the workpiece. For clarity, FIGS. 4 and 5 depict a portion of one type of workpiece that manufacturers can seat within chamber 22 and process with the system 10. Manufacturers can practice the invention using a focused particle beam system as schematically depicted herein. Two examples of FIB systems for practice of the invention are modified Micrion FIB system models 9100 and 8000, sold by Micrion Corporation of Peabody, Massachusetts.

Model 9100 has a multi-axis tilt stage and a 30 kcv Ga+ ion column with an imaging resolution of 10 nm. Model 9100 can be modified to deliver 2 gases at the same time to the vacuum chamber 22. Model 8000 has an interferometer guided x-y stage, a 30 kev Ga+ ion column with an imaging resolution of 25 nm. Model 8000 has the further capabilities of multiplex imaging and adaptive beam blanking. Model 8000 can also be modified to deliver 2 gases at the same time to the vacuum chamber 22.

With reference again to the illustrated embodiment of FIG. 1, the ion column 12 includes an ion source 14, an extraction electrode 16, a focusing element 18, deflection elements 19, and a focused ion beam 20. The ion column 12 sits above the vacuum chamber 22, and the vacuum chamber 22 houses a stage 24, a platform 26, a workpiece 30, a secondary particle detector 28 and a charge neutralization element 32. As further depicted by FIG. 1, the reactant material delivery system 34 includes a reservoir 36, a manometer 40, a motorized valve element 42, and delivery conduit 44. The user control station 50 can include a processor 52, a pattern recognition element 54, a memory element 56, a display element 60, a scan generator element 62, and dwell registers 64. For ease of description, the axis of the FIB will define a Z axis. Thus, the X-Y plane is defined as perpendicular to the axis of the FIB, i.e. the Z axis.

It will be apparent to one of ordinary skill in the art, that the system 10 depicted in FIG. 1 includes a conventional FIB system with an ion column 12 disposed above a vacuum chamber 22 that includes a reactant material delivery system 34 for providing reactant materials to the interior of chamber 22. As will be understood by one of ordinary skill in the art, the depicted ion column 12 is a schematic representation of one ion column suitable for practice with the invention. The depicted ion column 12 includes an ion source 14 that can be, for example, a liquid metal ion source (LMIS) such as a gallium ion source, or a gas field ion source (GFIS) such as a helium ion source. The ion source 14 sits above the extraction electrode 16. The extraction electrode 16 generates sufficient electric field to draw an ion stream from the ion source 14. The ion stream travels past focusing element 18, that can be conventional electro-optical lenses that focus the ion stream to the finely-focused beam 20. As further depicted, the ion column 12 includes the deflection elements 19 that can deflect the ion beam 20 to scan across the surface of the workpiece 30.

Similarly, the evacuation chamber 22 can be a conventional evacuation chamber that includes a stage element 24 for supporting a workpiece such as the delivery tray 26 that holds the workpiece 30. Preferably the platform 24 is a movable work stage that provides three-dimensional control of the displacement of the workpiece being operated on by the system 10. Similarly, evacuation chamber 22 includes a charge neutralization element 32, such as an electron gun, and further includes a secondary particle detector 28 for detecting secondary particles, such as electrons, ions, or any other particles suitable for generating an image of the workpiece. Any vacuum chamber 22 as schematically depicted herein can be practiced with the present invention, including the vacuum chamber that are incorporated with the above-mentioned FIB systems sold by Micrion Corporation of Peabody, Mass.

Similarly, the reactant material delivery system 34 can be any conventional reactant material delivery system suitable for delivering reactant material such as bromine gases into the interior of the vacuum chamber 22, and more particularly into the chamber 22 and proximate to the surface of the workpiece. The reactant material delivery system 34 can deliver materials to the surface of the workpiece 30 to enhance the etching from, or the imaging of, the surface of the workpiece.

The depicted reactant material 34 includes a reservoir 36 that couples in fluid communication with the fluid delivery conduit 44 that has a distal portion formed as a nozzle for delivering reactant materials to the surface of the workpiece. The depicted reactant delivery system 34 includes a manometer 40 coupled to conduit 44 for measuring the delivery pressure within conduit 44 of any reactant materials being delivered to the surface of the workpiece 30. Manometer 40 further couples to the motorized valve element 42. The motorized valve element 44 is selectively controllable for increasing or reducing the flow of reactant materials of reservoir 36 through fluid delivery conduit 44. The arrangement of the manometer 40 and motorized valve 42 depicted in FIG. 1 forms a feedback control system wherein the manometer 40 measures the delivery pressure within conduit 44 and selectively controls the motorized valve 42 to increase or decrease the flow of reactant material to thereby maintain a select delivery pressure.

Figure 2:
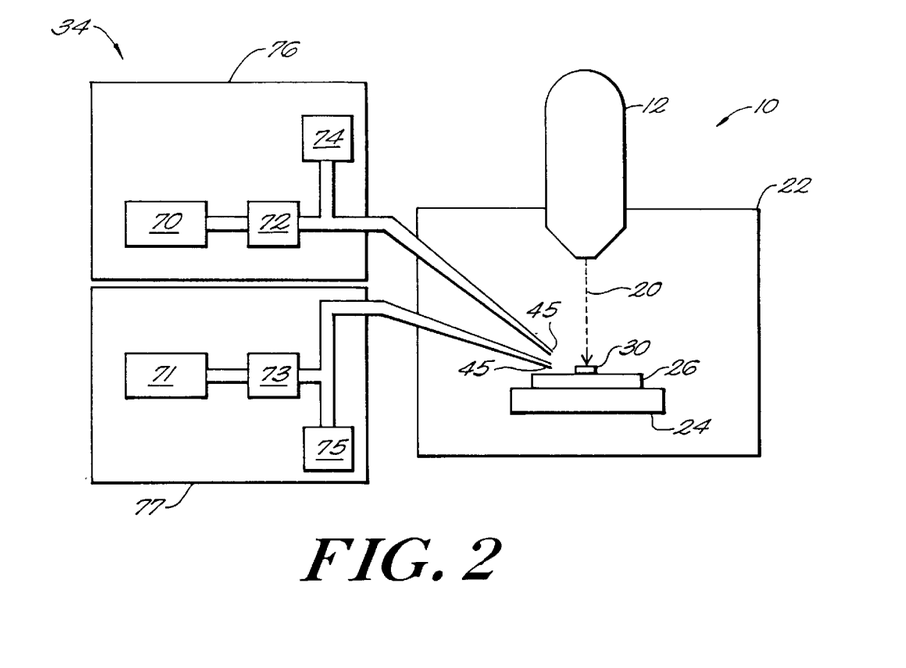
FIG. 2 is a schematic of one embodiment of a gas delivery system for use with the focused particle beam system of FIG. 1.

A preferred embodiment of the reactant material delivery system 34 is depicted in FIG. 2. This embodiment includes a dual nozzle system for delivering two etchants 70 and 71 simultaneously in selected proximity to the workpiece. Etchant flow rates are controlled by a feed-back loop between a motorized, variable orifice 72 and 73 and a pressure transducer 74 and 75.

Manufacturers can locate the nozzle tip or tips, according to the invention, in selected proximity to the target point where the FIB interacts with the workpiece. A preferred range for the distance between the target point and the nozzle tip or tips is 100 to 600 microns in the X-Y plane and 100 to 400 microns in the Z direction. Preferably, the inner diameter of the nozzle or nozzles is between 100 and 400 microns.

Figure 3:
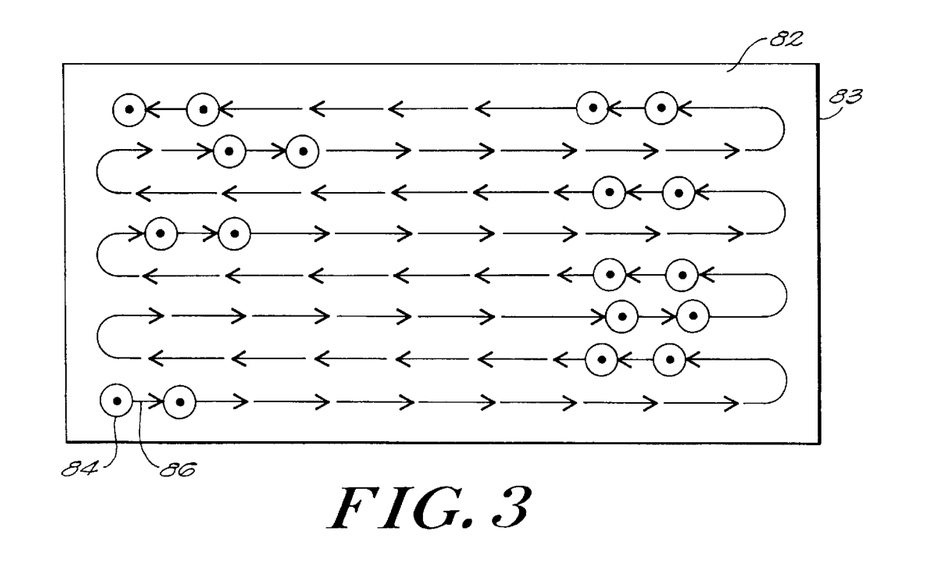
FIG. 3 illustrates the sequence of one type of raster scan of the focused particle beam of the system of FIG. 1 used in practice of the invention.

FIG. 3 shows the process of a raster scan of the focused particle beam of FIG. 1. The processor 52, based on the X & Y coordinates of a target object, directs the particle beam 20 to mill the surface of the workpiece 30 in accordance with the coordinates. It is important to note that the raster pattern outline 83 does not have to be rectangular as shown. The outline can have a variety of geometrical shapes, including circular or square. In one embodiment, the processor 112 generates a series of milling instructions for operating the ion column 12 to implement a digital raster pattern as depicted in FIG. 3. FIG. 3 illustrates a digital raster pattern 82 that comprises a series of pixel locations 84 with a corresponding pitch 86. The digital raster pattern shown is a serpentine raster pattern. However, manufacturers can employ a variety of raster patterns including a spiral pattern. Furthermore, the pitch is usually smaller than the beam spot size. A typical beam spot size is between approximately 0.7 microns and 0.2 microns. As depicted in FIG. 3, the processor element 52 generates a set of milling instructions which represent the X and Y locations for directing the particle beam 20 to mill the surface of the workpiece 30. Importantly, the processor is programmable.

FIGS. 4A to 4C illustrates one embodiment of the repair process of a film patterned on a substrate using the focused particle beam system of FIG. 1. The Figures show a cross-sectional view of a portion 30a of the workpiece 30. FIG. 4A shows the portion 30a of the workpiece having a film 90 with an excess portion 92 patterned on a substrate 88.

The present invention provides a process for removing an excess portion 92 from a film 90 patterned on a substrate 88 shown in FIGS. 4A and 5. A flow chart of one embodiment of the process according to the invention is provided in FIG. 7. With reference to FIGS. 4A–4C, 5, and 7, this embodiment includes the following steps: step 100 mount the workpiece 30 on a movable stage capable of movement in the X and Y directions; step 102 scan a selected surface area 98 of the workpiece (importantly, the depicted surface area 98 is only one example of such a surface area, i.e. the surface area scanned can be a different shape and size), having an opaque film patterned on a substrate, with a focused particle beam 20; step 104 introduce, concurrent to the scan step 102, an etching gas including bromine in selected proximity to the selected surface area; step 106 detect the intensities of particles emitted from the workpiece by scanning with the focused ion beam; step 108 determine a shape of the patterned film based on the detected particle intensities; step 110 determine an excess portion 92 of the patterned film; step 112 etch the excess portion with the focused ion beam; and step 114 introduce an etching gas, concurrent with the etching step, in selected proximity to the excess portion.

The etching gas can further include water vapor. In one embodiment of the invention, a preferred ratio of water vapor to Bromine is 1 mole of water to between 1 and 100 moles of Bromine. More preferably, the ratio is 1 mole of water to between 5 and 30 moles of Bromine, and more preferably still, about 1 mole of water to about 10 moles of Bromine.

Preferably, the base pressure for the vacuum should be on the order of $10^{-6}$ Torr or less. Preferably, the maximum flow rate from the gas nozzle or nozzles is limited by the allowable gas pressure rise in the specimen chamber. Thus, the flow rate should be limited to that value which does not raise the base pressure for the vacuum substantially above $10^{-5}$ Torr.

Manufacturers can pattern a variety of opaque films onto the substrate, including chromium film and molybdenum suicide film. In one embodiment of the invention, the substrate is quartz.

Figure 7:
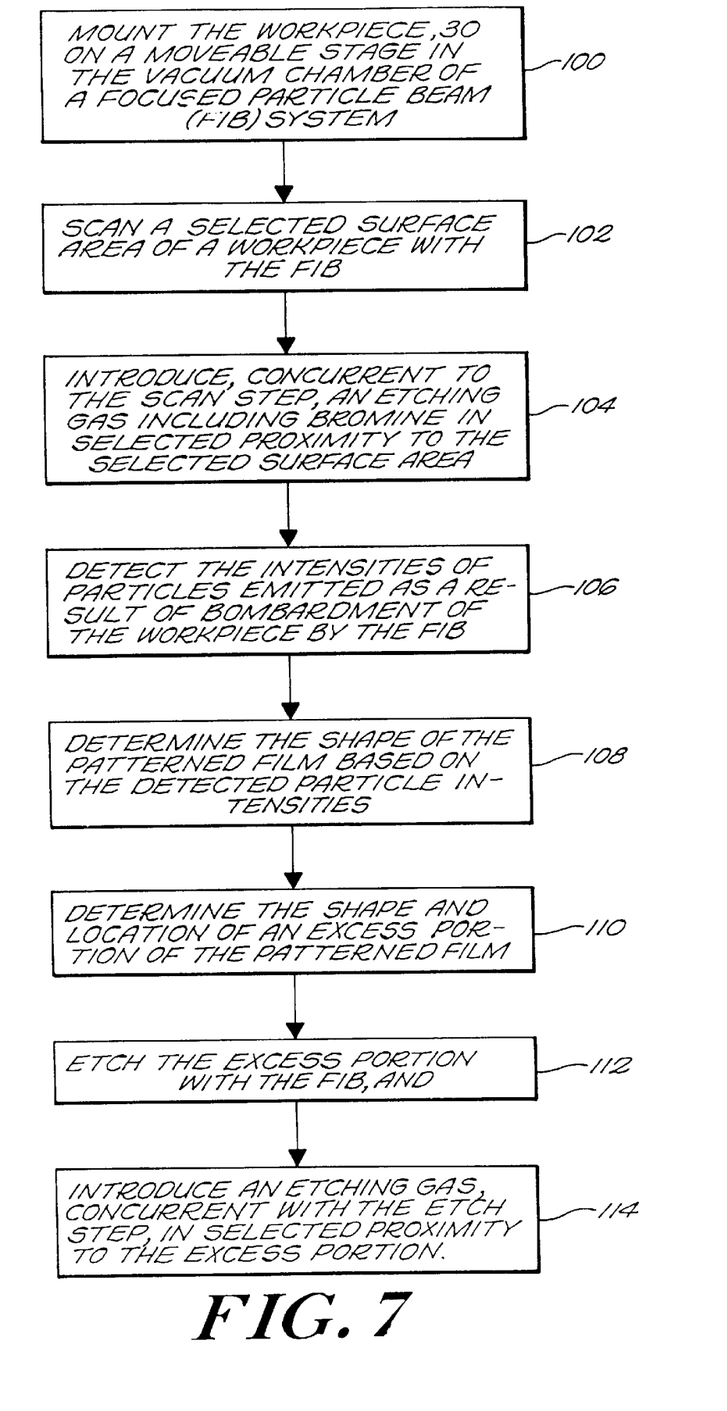
FIG. 7 is a flow chart of the process of repairing an opaque film patterned on a substrate according to the invention.

FIG. 4B shows a portion of the workpiece 30a after the completion of step 114 of FIG. 7. The focused particle beam system has repaired the workpiece by removing the excess portion 92 of the patterned film 90 with a focused particle beam 20.

In one practice of the invention, the method described above can further include the steps of (i) scanning a selected portion of the substrate with the focused particle beam, and (ii) applying a clean-up gas, concurrent to the substrate scanning step, to remove a surface layer of the selected portion of the substrate for insuring high transmission of electromagnetic radiation by the selected portion of the substrate. In a preferred embodiment, the clean-up gas is a fluorine-based clean-up gas, more preferably xenon difluoride.

FIG. 4C shows a portion of the workpiece 30a after applying a clean-up gas. The area 96 is shown in FIG. 4C with a layer removed relative to the same area 96 in FIG. 4B. Manufacturers use this clean-up step to remove staining of the substrate and to insure a high transmission of electromagnetic radiation through the substrate.

FIG. 5 is a top view of a portion 30a of the workpiece shown in FIGS. 4A–4C. FIG. 5 shows an opaque film 90 patterned on a substrate with an excess portion 92 removed. FIG. 5 further illustrates the associated divot or riverbed 97 that a focused particle beam can create as a result of etching the excess portion 92.

Figure 6:
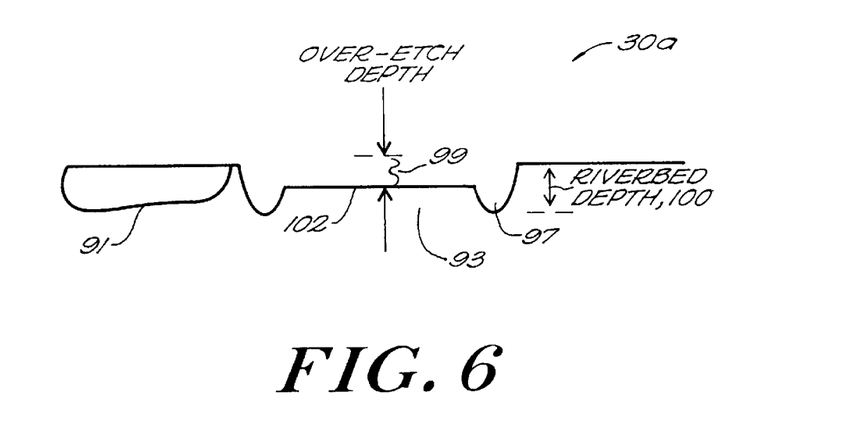
FIG. 6 is a schematic cross-sectional view of the repaired defect and associated riverbed of FIG. 5.

With reference to FIG. 6, the riverbed 97 is shown in cross section. Manufacturers attempt to keep the riverbed depth 100 to a minimum, particularly when manufacturing masks and reticles, as riverbeds can have unwanted effects on the transmission of electromagnetic radiation. GAE etching can remove portions of the substrate below the excess portion that is being removed. The removal of the substrate below an excess portion is termed an over-etch 99. Manufacturers attempt to keep the over-etch depth to a minimum. Furthermore, Manufacturers attempt to leave the substrate surface 102 below the removed excess portion 92 smooth and level, i.e. such that the surface 102 is substantially parallel to the X-Y plane and such that the majority of the surface 102 has Z coordinates that are substantially similar.

With reference again to FIG. 1, the operation of the ion column 12, charge neutralization element 32, and secondary particle detector 28 are controlled by the control station 50. The depicted control station 50 includes a processor element 52 that has a scan generator element 62 that includes dwell register 64. The processor element 52 couples via a transmission path to a control element 58 coupled to the ion beam column 12. The depicted processor element 52 can be a conventional computer processor element that includes a CPU element, a program memory, a data memory, and an input/output device. One suitable processor element 52 is a Sun Workstation operating a Unix operating system.

As further depicted by FIG. 1, the processor element 52 can connect, via the input/output device to a scan generator element 62. In one embodiment, the scan generator element is a circuit card assembly that connects to the processor 52 via the processor input/output device. The circuit card assembly scan generator element 62 depicted in FIG. 1 includes a scan memory for storing data representative of a scanning pattern that can be implemented by system 10 for scanning ion beam 20 across the surface of the workpiece 30 to selectively mill, or etch the surface of the workpiece 30.

The scan generator board element 62 depicted in FIG. 1 can be a conventional computer memory circuit card having sufficient memory for storing digital data information representative of locations of the workpiece that are to be processed by the particle beam system 10. Typically, a scan generator board suitable for practice with the present invention includes a series of memory locations, each of which corresponds to a location on the workpiece surface. Each memory location stores data representative of an X and Y location of the workpiece and preferably further has, for each X and Y location, a dwell register for storing digital data representative of a time for maintaining the particle beam on the surface of the workpiece at the location represented by the associated X, Y pair. Accordingly, the dwell register provides a memory location for storing a dwell time for applying the focused particle beam to the surface of the workpiece, to thereby allow control of the dose delivered to the workpiece.

It will be apparent to one of ordinary skill in the art of focused particle beam processes and systems that the dose delivered to a location on a workpiece surface can be understood to determine generally the depth to which material is removed from that location of the workpiece. Accordingly, the dwell time signal stored in the dwell register can also be understood as representative of a depth, or Z dimension, for the particle beam milling process. Consequently, the processor 52 that couples to such a scan generator board 62 provides a multi-dimensional milling element for generating milling signals that can control in three dimensions the milling or etching process of the focused particle beam system.

Accordingly, the processor 52 employs the X, Y and Z data maintained by the scan generator board 62 to generate milling signals that are transmitted via the transmission path 66 to the control element 58 of the ion column 12. In the depicted embodiment, the milling signals provide control element 58 with information for operating the deflector elements 19 to deflect the focused particle beam for scanning or rasterizing the focused particle beam across the surface of the workpiece 30, and to maintain the particle beam at the selected location for a specified dwell time to provide milling to a selected depth. The surface of the workpiece 30 generally corresponds to a two-dimensional plane that can be defined by an orthogonal pair of X and Y axes. A Z axis, that is generally understood as extending parallel to the path of the focused ion beam 20 is also generally orthogonal to the plane defined by the X and Y axis of the surface of the workpiece 30. By controlling the location of the particle beam 20 and the period of time for which the beam 20 impacts against the surface of the workpiece 30, material at selected locations of the workpiece 30 can be removed. Accordingly, the system 10 provides multidimensional control of the milling process to thereby allow the particle beam 20 to remove selected portions of the workpiece surface.

Although FIG. 1 depicts an ion column 12 that includes deflection elements 19 for deflecting an ion beam 20 to scan across the surface of the workpiece 30 and thereby direct the focused ion beam to a selected location on the surface of the workpiece 30, it will be apparent to one of ordinary skill in the art of focused particle beam processing that any system suitable for directing the focused particle beam to select locations of the workpiece surface can be practiced with the invention. For example, in an alternative embodiment, the platform 24 can be moved in an X, Y or Z space which corresponds to the X, Y and Z space of the milling process and the milling signals generated by the processor 52 can be provided to a stage control system that moves the stage carrying the workpiece 30 to thereby dispose a selected portion of the workpiece directly in the path of the focused particle beam to mill the workpiece 30. Other systems and methods for directing the particle beam can be practiced with the present invention without departing from the scope thereof.

As will be seen from the above description, the system 10 depicted in FIG. 1 provides a system for repairing opaque films patterned on a substrate that automatically identifies the location and geometry of an excess portion and, generates from the location and geometric information a set of etching signals that direct the focused particle beam to etch the workpiece and thereby remove an excess portion providing a patterned film with a precise shape.

EXAMPLE

The following procedure was preformed: Micrion FIB systems 9100 and 8000 were used for GAE experiments. The Applicant performed a procedure according to the invention where the opaque materials were chromium-based film and molybdenum silicide-based film and the transparent substrate material was quartz. The base pressure in the vacuum chamber was about $10^{-6}$ Torr. The components of the etching gas were delivered through two nozzles. A preferred range between the nozzle tip and the location of the focused particle beam's interaction with the workpiece was about 100 to 600 microns in the X-Y plane and about 100 to 400 microns in the Z direction. The inner diameter of the nozzles were between 100 and 400 microns.

Scanning Electron Microscope

A JEOL model 6400 field emission scanning electron microscope was used, at low acceleration voltage, to evaluate the opaque repairs.

Optical Microscope

Optical microscopes with reflective, transmission and interference imaging capabilities were used for preliminary evaluation of the chromium-based film and the molybdenum silicide-based film removal, quartz riverbeds and Ga staining (in the visible wavelength region).

Atomic Force Microscope

Opaque repairs were evaluated by atomic force microscopy (Advanced Materials Laboratory Concord, Mass.). Three dimensional repair profiles characterized the completeness of absorber removal, the repair smoothness and riverbed dimensions.

Dektak Profilometer

Etch enhancements of chromium-based film, molybdenum silicide-based film and quartz were determined with a Dektak IIA profilometer with a 2 $\mu$m stylus. Details concerning riverbeds and surface roughness required AFM analysis.

Bromine-based Etchant Mixture for Cr

A gas mixture including bromine and water vapor was developed which enhances the removal of Cr 2 fold relative to straight sputtering while inhibiting the removal of quartz 30–70% relative to straight sputtering. The ratio of water vapor to bromine was 1 mole of water to from about 5 moles to about 30 moles of bromine. The most preferred ratio was about 1 mole of water to about 10 moles of Bromine. AFM evaluations of Cr repairs with this bromine-based etchant mixture suggests that riverbeds <35 nm are achievable.

Bromine-Based Etchant Mixture for molybdenum silicide

A gas mixture including bromine and water vapor, similar to that reported above for Cr masks, was developed which enhances the removal of molybdenum silicide 2 fold relative to straight sputtering while inhibiting the removal of quartz 30–70% relative to straight sputtering.

The benefits of bromine and water vapor assisted etching to the repair of opaque defects included:

the Ga beam dose required to remove of the chromium-based film is 2.0 to 2.2 times less than with non-gas-assisted sputter etching;

there is minimal damage done to the underlying substrate; the quartz surface is left smooth and level; the over-etch is 1–5 nm;

the depth of riverbeds at the perimeter of the opaque defect are markedly smaller than observed for non-gas-assisted sputter etching; bromine-assisted etching produces riverbeds of between 5–25 nm, a large improvement over the pure sputter etching riverbeds of 80–100 nm;

the reduction in implanted Ga and thus the reduction in staining (loss of % T) in the transparent quartz substrate;

the % T (transmission) in and around the repaired area was greater than 97% at a wavelength of 365 nm.

As can be seen from the above description, the invention provides improved methods for repairing a workpiece having an opaque film patterned on a substrate using GAE. It will be appreciated by those skilled in the art of GAE that changes can be made to the embodiments and processes described above without departing from the broad inventive concept thereof. It will further be understood therefore, that the invention is not to be limited to the particular embodiments disclosed herein but is intended to cover modifications within the spirit and scope of the present invention as defined by the appended claims.

We claim:

1. A method for preparing a workpiece having a pattern of opaque film on a substrate to attain areas of selected electromagnetic transparency and areas of selected electromagnetic opacity, said method including the removal from the workpiece of an excess portion of an opaque film patterned on a substrate and comprising the steps of irradiating said excess portion on said workpiece with a particle beam, introducing an etching gas, concurrent with said irradiating step, in selected proximity to said excess portion, said etching gas including bromine and water vapor, and discontinuing said irradiating step upon the removal of a selected portion from said opaque film.

2. The method recited in claim 1 in which said opaque film is selected from the group of opaque films including chromium film and molybdenum silicide film.

3. The method recited in claim 1 in which the ratio of water to bromine is 1 mole of water to between 1 and 100 moles of bromine.

4. The method recited in claim 1 in which the ratio of water to bromine is 1 mole of water to between 5 and 30 moles of bromine.

5. The method recited in claim 1 in which said substrate is quartz.

6. The method recited in claim 1 further comprising the steps of irradiating a selected portion of said substrate, subsequent to said discontinuing step, with said particle beam, and applying a clean-up gas, concurrent to said substrate irradiating step, to remove a surface layer of said selected portion of said substrate for ensuring high transmission of electromagnetic radiation by said selected portion of said substrate.

7. The method recited in claim 6 in which said clean-up gas is fluorine-based.

8. The method recited in claim 7 in which said clean-up gas is xenon difluoride.

9. The method recited in claim 1 further comprising the step of mounting said workpiece, prior to said irradiating step, on a movable stage capable of movement in the X and Y directions, said film being patterned on said substrate, said film having an excess portion.

10. The method recited in claim 1 in which said irradiating step further comprises the step of limiting the amount of etching gas introduced in selected proximity to said excess portion to restrict damage to other elements of said particle beam system due to the presence of an excessive amount of said etching gas.

11. The method recited in claim 1 in which said workpiece is selected from the group of workpieces including photomasks, X-ray masks, and reticles.

12. A method for preparing a workpiece having a pattern of opaque film on a substrate to attain areas of selected electromagnetic transparency and areas of selected electromagnetic opacity, said method including the removal from the workpiece of an excess portion of an opaque film patterned on a substrate and comprising the steps of scanning a selected surface area of a workpiece, having an opaque film patterned on a substrate, with a particle beam, detecting intensities of particles emitted from said workpiece as a result of said scanning of said workpiece with said particle beam, determining a shape of said patterned film based on said detected particle intensities, determining an excess portion of said patterned film, etching said excess portion with said particle beam, and introducing an etching gas, concurrent with said etching step, in selected proximity to said excess portion, said etching gas including bromine and water vapor.

13. The method recited in claim 12 in which said opaque film is selected from the group of opaque films including chromium film and molybdenum silicide film.

14. The method recited in claim 12 in which the ratio of water to bromine is 1 mole of water to between 1 and 100 moles of bromine.

15. The method recited in claim 12 in which the ratio of water to bromine is 1 mole of water to between 5 and 30 moles of bromine.

16. The method recited in claim 12 in which said substrate is quartz.

17. The method recited in claim 12 further comprising the steps of scanning a selected portion of said substrate with said particle beam, and applying a clean-up gas, concurrent to said substrate scanning step, to remove a surface layer of said selected portion of said substrate for ensuring high transmission of electromagnetic radiation by said selected portion of said substrate.

18. The method recited in claim 17 in which said clean-up gas is fluorine-based.

19. The method recited in claim 18 in which said clean-up gas is xenon difluoride.

20. The method recited in claim 12 further comprising the step of mounting said workpiece, prior to said workpiece scanning step, on a movable stage capable of movement in the X and Y directions, said film being patterned on said substrate, said film having an excess portion.

21. The method as recited in claim 12 in which said irradiating step further comprises the step of restricting damage to other elements of the particle beam system due to the presence of an excessive amount of said etching gas by controlling the amount of etching gas introduced in selected proximity to said excess portion.

22. The method recited in claim 12, further comprising the step of introducing an etching gas, concurrent with said workpiece scanning step, in selected proximity to said selected surface area, said etching gas including bromine.

23. A method for preparing a workpiece having a pattern of chromium film on a substrate to attain areas of selected electromagnetic transparency and areas of selected electromagnetic opacity, said method including the removal from the workpiece of an excess portion of a chromium film patterned on a substrate and comprising the steps of irradiating an excess portion of chromium film patterned on a substrate with a particle beam on said workpiece, introducing an etching gas, concurrent with said irradiating step, in selected proximity to said excess portion, said etching gas including bromine, and discontinuing said irradiating step upon the removal of a selected portion from said chromium film.

24. The method recited in claim 23 in which said etching gas further includes water vapor.

25. A method for employing a particle beam system in the removal of an excess portion from a workpiece having a chromium film patterned on a substrate, comprising the steps of irradiating said excess portion on said workpiece with a particle beam, introducing an etching gas, concurrent with said irradiating step, in selected proximity to said excess portion, said etching gas including bromine, and discontinuing said irradiating step upon the removal of a selected portion from said chromium film, whereby said introducing step, concurrent with said etching step, provides for the removal of said excess portion leaving a smooth and level substrate surface.

* * * * *